United States Patent
Park et al.

(10) Patent No.: US 11,437,438 B2
(45) Date of Patent: *Sep. 6, 2022

(54) PHOTOELECTRIC CONVERSION DEVICES AND ORGANIC SENSORS AND ELECTRONIC DEVICES

(71) Applicant: Samsung Electronics Co., Ltd., Suwon-si (KR)

(72) Inventors: Kyung Bae Park, Hwaseong-si (KR); Chui Joon Heo, Busan (KR); Sung Young Yun, Suwon-si (KR); Gae Hwang Lee, Seongnam-si (KR); Yong Wan Jin, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 37 days.

This patent is subject to a terminal disclaimer.

(21) Appl. No.: 17/128,782

(22) Filed: Dec. 21, 2020

(65) Prior Publication Data

US 2021/0118956 A1    Apr. 22, 2021

Related U.S. Application Data

(63) Continuation of application No. 16/524,626, filed on Jul. 29, 2019, now Pat. No. 10,886,336.

(30) Foreign Application Priority Data

Nov. 14, 2018  (KR) .......................... 10-2018-0139824

(51) Int. Cl.
  *H01L 27/30*  (2006.01)
  *H01L 51/00*  (2006.01)
  (Continued)

(52) U.S. Cl.
  CPC ........ *H01L 27/307* (2013.01); *H01L 51/0089* (2013.01); *H01L 51/428* (2013.01); *H01L 51/442* (2013.01)

(58) Field of Classification Search
  CPC . H01L 27/307; H01L 51/442; H01L 51/0089; H01L 51/428
  See application file for complete search history.

(56) References Cited

U.S. PATENT DOCUMENTS 7,056,180 B2    6/2006  Morii
8,217,391 B2    7/2012  Horiba et al.
(Continued)

FOREIGN PATENT DOCUMENTS

EP    2706586 A1    3/2014

OTHER PUBLICATIONS

Iyer, R., et al. "Design, implementation, and characterization of an optical power supply spot-array generator for a four-stage free-space optical backplane" *Applied Optics* vol. 36, No. 35, Dec. 10, 2017.

(Continued)

*Primary Examiner* — Karen Kusumakar
(74) *Attorney, Agent, or Firm* — Harness, Dickey & Pierce, P.L.C.

(57) ABSTRACT

A photoelectric conversion device includes a first electrode and a second electrode facing each other, a photoelectric conversion layer between the first electrode and the second electrode and configured to absorb light in at least one part of a wavelength spectrum of light and to convert it into an electric signal, and an inorganic nanolayer between the first electrode and the photoelectric conversion layer and including a lanthanide element, calcium (Ca), potassium (K), aluminum (Al), or an alloy thereof. An organic CMOS image sensor may include the photoelectric conversion (Continued)

device. An electronic device may include the organic CMOS image sensor.

24 Claims, 17 Drawing Sheets

(51) Int. Cl.
  *H01L 51/42* (2006.01)
  *H01L 51/44* (2006.01)

(56) References Cited

U.S. PATENT DOCUMENTS

| 8,778,512 B2 | 7/2014 | Dorok et al. |
| 2007/0057339 A1 | 3/2007 | Mitsui et al. |
| 2014/0070183 A1 | 3/2014 | Park et al. |
| 2016/0111473 A1 | 4/2016 | Liu et al. |
| 2016/0118609 A1 | 4/2016 | Takayama et al. |
| 2016/0380221 A1 | 12/2016 | Gotanda et al. |
| 2017/0294485 A1* | 10/2017 | Joei .................. H01L 31/10 |

OTHER PUBLICATIONS

Gyu Min Kim et al., "Applications of ytterbium in inverted organic photovoltaic cells as high-performance and stable electron transport layers" Journal of Materials Chemistry A, vol. 2, pp. 10131-10136 (2014).

Extended European Search Report dated Apr. 6, 2020 for corresponding European Application No. 19200760.7.

Park et al., "Work function of indium tin oxide transparent conductor measured by photoelectron spectroscopy", Appl. Phys. Lett. 68 (19) 1996 (Year: 1996).

* cited by examiner

PHOTOELECTRIC CONVERSION DEVICES AND ORGANIC SENSORS AND ELECTRONIC DEVICES

CROSS-REFERENCE TO RELATED APPLICATION

This application is a continuation of U.S. application Ser. No. 16/524,626, filed on Jul. 29, 2019, which claims priority to and the benefit of Korean Patent Application No. 10-2018-0139824 filed in the Korean Intellectual Property Office on Nov. 14, 2018, the entire contents of each of which are incorporated herein by reference.

BACKGROUND

1. Field

Photoelectric conversion devices, organic sensors, and electronic devices are disclosed.

2. Description of the Related Art

A photoelectric conversion device may receive incident light and converts the received incident light into an electric signal. A photoelectric conversion device may include a photodiode and a phototransistor, and may be applied to ("included in") an organic sensor, a photodetector, a solar cell, or the like.

Organic sensors may have higher resolutions and thus may have smaller pixel sizes. Organic sensors may include silicon photodiodes. A sensitivity of a silicon photodiode in an organic sensor may be deteriorated based on reduced pixel size of the organic sensor the absorption area of the silicon photodiode may be reduced. Accordingly, organic materials that are capable of replacing silicon in photodiodes of organic sensors have been researched.

An organic material has a high extinction coefficient and is configured to selectively absorb light in a particular wavelength spectrum of light depending on a molecular structure of the organic material, and thus may simultaneously replace a photodiode and a color filter of an organic sensor and resultantly improve sensitivity of the organic sensor and contribute to high integration of the organic sensor.

However, since such organic materials exhibit different characteristics from those of silicon due to high binding energy and a recombination behavior associated with such organic materials, the characteristics of the organic materials are difficult to precisely predict, and thus required properties of a photoelectric conversion device may not be easily controlled.

SUMMARY

Some example embodiments provide one or more photoelectric conversion devices capable of improving charge extraction efficiency.

Some example embodiments provide organic sensors including one or more of the photoelectric conversion device.

Some example embodiments provide electronic devices including the one or more photoelectric conversion devices or the one or more organic sensors.

According to some example embodiments, a photoelectric conversion device may include a first electrode and a second electrode facing each other, a photoelectric conversion layer between the first electrode and the second electrode, the photoelectric conversion layer configured to absorb light in at least one part of a wavelength spectrum of light and to convert the absorbed light into an electric signal, and an inorganic nanolayer between the first electrode and the photoelectric conversion layer, the inorganic nanolayer including a lanthanide element, calcium (Ca), potassium (K), aluminum (Al), or an alloy thereof.

The inorganic nanolayer may include the lanthanide element, and the lanthanide element includes ytterbium (Yb).

The inorganic nanolayer may be in contact with the first electrode.

One surface of the inorganic nanolayer may be in contact with the first electrode, and another, opposite surface of the inorganic nanolayer may be in contact with the photoelectric conversion layer.

The first electrode may include a transparent electrode having a light transmittance of greater than or equal to about 80%, or a reflective electrode having a light transmittance of less than about 10%.

The first electrode may include the transparent electrode, and the transparent electrode includes at least one of an oxide conductor and a carbon conductor.

A thickness of the inorganic nanolayer may be less than or equal to about 5 nm.

A thickness of the inorganic nanolayer may be less than or equal to about 2 nm.

The first electrode may be a cathode and the second electrode is an anode.

According to some example embodiments, a photoelectric conversion device may include a first electrode, the first electrode including a conductor, the conductor being a transparent conductor having a light transmittance of greater than or equal to about 80%, or a reflective conductor having a light transmittance of less than about 10%. The photoelectric conversion device may include a photoelectric conversion layer on the first electrode, the photoelectric conversion layer configured to absorb light in at least one part wavelength spectrum of light and to convert the absorbed light into an electric signal, and a second electrode on the photoelectric conversion layer. A surface of the first electrode facing the photoelectric conversion layer may be covered by an inorganic nanolayer, the inorganic nanolayer having a thickness of less than or equal to about 5 nm. An effective work function at the surface of the first electrode facing the photoelectric conversion layer may be less than a work function of the conductor.

A difference between the work function of the conductor and the effective work function at the surface of the first electrode facing the photoelectric conversion layer may be greater than or equal to about 0.5 eV.

The work function of the conductor may be greater than or equal to about 4.5 eV, and the effective work function at the surface of the first electrode facing the photoelectric conversion layer may be less than or equal to about 4.0 eV.

The effective work function at the surface of the first electrode facing the photoelectric conversion layer may be less than or equal to about 3.0 eV.

The inorganic nanolayer may include an inorganic material, and the inorganic material includes a lanthanide element, calcium (Ca), potassium (K), aluminum (Al), or an alloy thereof.

The inorganic material may include the lanthanide element, and the lanthanide element includes ytterbium (Yb).

The transparent conductor may include an oxide conductor or a carbon conductor.

The inorganic nanolayer may have a thickness of less than or equal to about 2 nm.

The first electrode may be a cathode and the second electrode may be an anode.

An electronic device may include the photoelectric conversion device.

An organic sensor may include the photoelectric conversion device. The organic sensor may be an organic complementary metal-oxide-semiconductor (CMOS) sensor. An electronic device may include the organic sensor such as the organic CMOS image sensor.

According to some example embodiments, an organic complementary metal-oxide-semiconductor (CMOS) image sensor may include a semiconductor substrate; and a plurality of photoelectric conversion devices on the semiconductor substrate, the plurality of photoelectric conversion devices configured to convert different wavelength spectra of light into electric signals, respectively. Each photoelectric conversion device of the plurality of photoelectric conversion devices may include a first electrode and a second electrode facing each other, the first electrode including a conductor, the conductor being a transparent conductor having a light transmittance of greater than or equal to about 80%, or a reflective conductor having a light transmittance of less than about 10%; and a photoelectric conversion layer between the first electrode and the second electrode, the photoelectric conversion layer configured to absorb light in at least one part of a wavelength spectrum of light and to convert the absorbed light into an electric signal. A surface of the first electrode facing the photoelectric conversion layer may be covered by an inorganic nanolayer, the inorganic nanolayer having a thickness of less than or equal to about 5 nm. An effective work function at the surface of the first electrode facing the photoelectric conversion layer may be less than a work function of the conductor. The plurality of photoelectric conversion devices may include different photoelectric conversion layers configured to absorb different wavelength spectra of light.

The plurality of photoelectric conversion devices may be arranged horizontally on the semiconductor substrate, such that the plurality of photoelectric conversion devices overlap each other in a direction extending parallel to a top surface of the semiconductor substrate.

The plurality of photoelectric conversion devices may be arranged vertically on the semiconductor substrate, such that the plurality of photoelectric conversion devices overlap each other in a direction extending perpendicular to a top surface of the semiconductor substrate, and one photoelectric conversion device of the plurality of photoelectric conversion devices overlaps with a limited portion of another photoelectric conversion device of the plurality of photoelectric conversion devices in the direction extending perpendicular to the top surface of the semiconductor substrate.

The inorganic nanolayer may include an inorganic material, and the inorganic material includes a lanthanide element, calcium (Ca), potassium (K), aluminum (Al), or an alloy thereof.

The inorganic nanolayer may include the lanthanide element, and the lanthanide element may include ytterbium (Yb).

A difference between the work function of the conductor and the effective work function at the surface of the first electrode facing the photoelectric conversion layer may be greater than or equal to about 0.5 eV.

The work function of the conductor may be greater than or equal to about 4.5 eV, and the effective work function at the surface of the first electrode facing the photoelectric conversion layer may be less than or equal to about 4.0 eV.

An electronic device may include the organic sensor.

According to some example embodiments, an organic complementary metal-oxide-semiconductor (CMOS) image sensor may include a semiconductor substrate; a photo-sensing device integrated in the semiconductor substrate, the photo-sensing device configured to convert a first wavelength spectrum of light into electric signals; and a photoelectric conversion device on the semiconductor substrate, the photoelectric conversion device configured to convert a second wavelength spectrum of light into electric signals. The photoelectric conversion device may include a first electrode and a second electrode facing each other, the first electrode including a conductor, the conductor being a transparent conductor having a light transmittance of greater than or equal to about 80%, or a reflective conductor having a light transmittance of less than about 10%, and a photoelectric conversion layer between the first electrode and the second electrode, the photoelectric conversion layer configured to absorb light in at least one part of a wavelength spectrum of light and to convert the absorbed light into an electric signal. A surface of the first electrode facing the photoelectric conversion layer may be covered by an inorganic nanolayer, the inorganic nanolayer having a thickness of less than or equal to about 5 nm. An effective work function at the surface of the first electrode facing the photoelectric conversion layer may be less than a work function of the conductor.

The organic CMOS image sensor may further include a color filter configured to selectively transmit a particular wavelength spectrum of light to the photo-sensing device, such that the photo-sensing device is configured to absorb the particular wavelength spectrum of light.

The inorganic nanolayer may include an inorganic material, and the inorganic material may include a lanthanide element, calcium (Ca), potassium (K), aluminum (Al), or an alloy thereof.

The inorganic nanolayer may include the lanthanide element, and the lanthanide element includes ytterbium (Yb).

A difference between the work function of the conductor and the effective work function at the surface of the first electrode facing the photoelectric conversion layer may be greater than or equal to about 0.5 eV.

The work function of the conductor may be greater than or equal to about 4.5 eV, and the effective work function at the surface of the first electrode facing the photoelectric conversion layer may be less than or equal to about 4.0 eV.

An electronic device may include the organic CMOS image sensor of claim 30.

DETAILED DESCRIPTION

Figure 1:
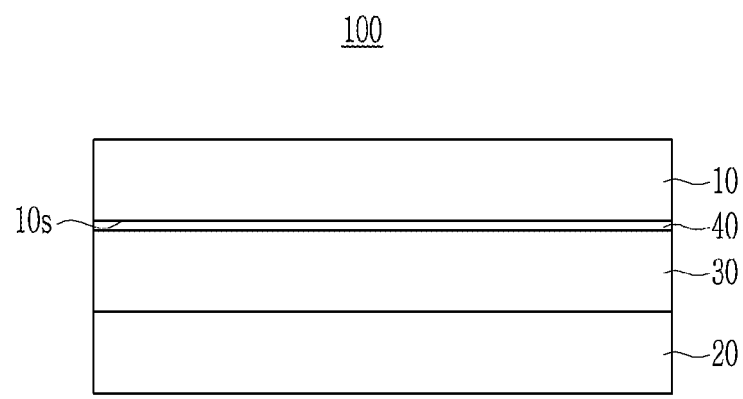
FIG. 1 is a cross-sectional view showing a photoelectric conversion device according to some example embodiments.

Hereinafter, example embodiments of the present disclosure will be described in detail so that a person skilled in the art would understand the same. However, this disclosure may be embodied in many different forms and is not to be construed as limited to the example embodiments set forth herein.

In the drawings, the thickness of layers, films, panels, regions, etc., are exaggerated for clarity.

It will be understood that when an element such as a layer, film, region, or substrate is referred to as being "on" another element, it may be directly on the other element or intervening elements may also be present. In contrast, when an element is referred to as being "directly on" another element, there are no intervening elements present.

As used herein, when a definition is not otherwise provided, "substituted" may refer to replacement of a hydrogen atom of a compound by a substituent selected from a halogen atom, a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, phosphoric acid or a salt thereof, silyl group, a C1 to C20 alkyl group, a C2 to C20 alkenyl group, a C2 to C20 alkynyl group, a C6 to C30 aryl group, a C7 to C30 arylalkyl group, a C1 to C30 alkoxy group, a C1 to C20 heteroalkyl group, a C3 to C20 heteroaryl group, a C3 to C20 heteroarylalkyl group, a C3 to C30 cycloalkyl group, a C3 to C15 cycloalkenyl group, a C6 to C15 cycloalkynyl group, a C3 to C30 heterocycloalkyl group, and a combination thereof.

As used herein, when a definition is not otherwise provided, "hetero" may refer to one including 1 to 4 heteroatoms selected from N, O, S, Se, Te, Si, and P.

As used herein, when a definition is not otherwise provided, "heterocyclic group" is a generic concept of a heteroaryl group, may include an aromatic and non-aromatic ring including at least one heteroatom, and may include at least one heteroatom selected from N, O, S, P, and Si instead of carbon (C) in a cyclic compound such as an aryl group, a cycloalkyl group, a fused ring thereof, or a combination thereof. When the heterocyclic group is a fused ring, the entire ring or each ring of the heterocyclic group may include one or more heteroatoms.

Hereinafter, "combination" may refer to a mixture of two or more and a stack structure of two or more.

Hereinafter, a work function or an energy level is expressed as an absolute value from a vacuum level. In addition, when the work function or the energy level is referred to be deep, high, or large, it may have a large absolute value from "0 eV" of the vacuum level while when the work function or the energy level is referred to be shallow, low, or small, it may have a small absolute value from "0 eV" of the vacuum level.

Hereinafter, a photoelectric conversion device according to some example embodiments is described.

FIG. 1 is a cross-sectional view showing a photoelectric conversion device according to some example embodiments.

Referring to FIG. 1, a photoelectric conversion device 100 according to some example embodiments includes a first electrode 10, a second electrode 20, a photoelectric conversion layer 30, and an inorganic nanolayer 40.

A substrate (not shown) may be disposed at the side of the first electrode 10 or the second electrode 20. The substrate may be for example made of an inorganic material such as glass, an organic material such as polycarbonate, polymethylmethacrylate, polyethyleneterephthalate, polyethylenenaphthalate, polyamide, polyethersulfone, or a combination thereof, or a silicon wafer. The substrate may be omitted.

As shown, the first electrode 10 and the second electrode 20 are facing each other. One of the first electrode 10 and the second electrode 20 is an anode and the other is a cathode. In some example embodiments, the first electrode 10 may be a cathode and the second electrode 20 may be an anode. In another example, the first electrode 10 may be an anode and the second electrode 20 may be a cathode.

At least one of the first electrode 10 and the second electrode 20 may be a transparent electrode, such that the at least one of the first electrode 10 and the second electrode 20 includes a transparent conductor. Herein, the transparent electrode may include a transparent conductor having a high light transmittance of greater than or equal to about 80% and may not include for example a semi-transparent electrode for microcavity. The transparent electrode may include for example a transparent conductor that includes at least one of an oxide conductor and a carbon conductor. The oxide conductor may include for example at least one of indium tin oxide (ITO), indium zinc oxide (IZO), zinc tin oxide (ZTO), aluminum tin oxide (AlTO), and aluminum zinc oxide (AZO) and the carbon conductor may at least one of graphene and carbon nanostructure.

One of the first electrode 10 and the second electrode 20 may be a reflective electrode, such that the at least one of the first electrode 10 and the second electrode 20 includes a reflective conductor. Here, the reflective electrode may include, in some example embodiments, a reflective conductor having a light transmittance of less than about 10% or high reflectance of less than or equal to about 5%. The reflective electrode may include a reflective conductor such as a metal and may include, for example aluminum (Al), silver (Ag), gold (Au), or an alloy thereof.

In view of the above, it will be understood that the first electrode 10 and/or the second electrode 20 may include a conductor, where the conductor may be a transparent conductor or a reflective conductor. A conductor that is a transparent conductor may have a light transmittance of greater than or equal to about 80%. A conductor that is a reflective conductor may having a light transmittance of less than about 10%.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

In some example embodiments, the first electrode 10 may be a transparent electrode having a light transmittance of greater than or equal to about 80% or a reflective electrode having a light transmittance of less than about 10%.

The photoelectric conversion layer 30, which, as shown, is between the first electrode 10 and the second electrode 20, may be configured to absorb light in at least one part of a wavelength spectrum of light and convert the absorbed light into an electric signal, and for example one of light in a green wavelength spectrum of light (hereinafter, referred to as "green light"), light in a blue wavelength spectrum of light (hereinafter, referred to as "blue light"), light in a red wavelength spectrum of light (hereinafter, referred to as "red light"), light in an ultraviolet wavelength spectrum of light (hereinafter, referred to as 'ultraviolet light'), and light in an infrared wavelength spectrum of light (hereinafter, referred to as "infrared light") into an electric signal.

In some example embodiments, the photoelectric conversion layer 30 may be configured to selectively absorb at least one of the green light, the blue light, the red light, and the infrared light. Herein, the selective absorption of at least one from the green light, the blue light, the red light, and the infrared light means that a light-absorption spectrum has a peak absorption wavelength (λmax) in one of about 500 nm to about 600 nm, greater than or equal to about 380 nm and less than about 500 nm, greater than about 600 nm and less than or equal to about 700 nm, and greater than about 700 nm, and a light-absorption spectrum in the corresponding wavelength spectrum of light may be remarkably higher than those in the other wavelength spectra of light.

The photoelectric conversion layer 30 may include a semiconductor material that is at least one p-type semiconductor and/or at least one n-type semiconductor, where the semiconductor material forms a pn junction with the first organic material of the photoelectric conversion layer 30 and may produce excitons by receiving light from outside and then separate the produced excitons into holes and electrons.

The p-type semiconductor and the n-type semiconductor may be independently light-absorbing materials, and for example at least one of the p-type semiconductor and the n-type semiconductor may be an organic light-absorbing material. In some example embodiments, at least one of the p-type semiconductor and the n-type semiconductor may be a wavelength-selective light-absorbing material that selectively absorbs light in a particular (or, alternatively, predetermined) wavelength spectrum of light, and for example at least one of the p-type semiconductor and the n-type semiconductor may be a wavelength-selective organic light-absorbing material. The p-type semiconductor and the n-type semiconductor may have a peak absorption wavelength ($\lambda_{max}$) in the same wavelength spectrum of light or in a different wavelength spectrum of light.

In some example embodiments, the p-type semiconductor may be an organic material having a core structure including an electron donating moiety, a pi conjugation linking group, and an electron accepting moiety.

The p-type semiconductor may be for example represented by Chemical Formula 1, but is not limited thereto.

EDG-HA-EAG [Chemical Formula 1]

In Chemical Formula 1,
HA is a C2 to C30 heterocyclic group having at least one of S, Se, Te, and Si,
EDG is an electron-donating group, and
EAG is an electron accepting group.

In some example embodiments, the p-type semiconductor represented by Chemical Formula 1 may be for example represented by Chemical Formula 1A.

[Chemical Formula 1A]

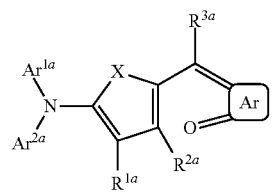

In Chemical Formula 1A,
X may be S, Se, Te, SO, $SO_2$, or $SiR^aR^b$,
Ar may be a substituted or unsubstituted C6 to C30 arylene group, a substituted or unsubstituted C3 to C30 heterocyclic group, or a fused ring of the foregoing two or more,
$Ar^{1a}$ and $Ar^{2a}$ may independently be a substituted or unsubstituted C6 to C30 aryl group or a substituted or unsubstituted C3 to C30 heteroaryl group,
$Ar^{1a}$ and $Ar^{2a}$ may independently be present alone or may be linked with each other to form a fused ring, and
$R^{1a}$ to $R^{3a}$, $R^a$, and $R^b$ may independently be hydrogen, deuterium, a substituted or unsubstituted C1 to C30 alkyl group, a substituted or unsubstituted C6 to C30 aryl group, a substituted or unsubstituted C3 to C30 heteroaryl group, a substituted or unsubstituted C1 to C6 alkoxy group, a halogen, or a cyano group.

In some example embodiments, in Chemical Formula 1A, $Ar^{1a}$ and $Ar^{2a}$ may independently be one of a substituted or unsubstituted phenyl group, a substituted or unsubstituted naphthyl group, a substituted or unsubstituted anthracenyl group, a substituted or unsubstituted phenanthrenyl group, a substituted or unsubstituted pyridinyl group, a substituted or unsubstituted pyridazinyl group, a substituted or unsubstituted pyrimidinyl group, a substituted or unsubstituted pyrazinyl group, a substituted or unsubstituted quinolinyl group, a substituted or unsubstituted isoquinolinyl group, a substituted or unsubstituted naphthyridinyl group, a substituted or unsubstituted cinnolinyl group, a substituted or unsubstituted quinazolinyl group, a substituted or unsubstituted phthalazinyl group, a substituted or unsubstituted benzotriazinyl group, a substituted or unsubstituted pyridopyrazinyl group, a substituted or unsubstituted pyridopyrimidinyl group, and a substituted or unsubstituted pyridopyridazinyl group.

In some example embodiments, $Ar^{1a}$ and $Ar^{2a}$ of Chemical Formula 1A may be linked with each other to form a ring or in some example embodiments, $Ar^{1a}$ and $Ar^{2a}$ may be linked with each other by one of a single bond, —$(CR^gR^h)_{n2}$— (n2 is 1 or 2), —O—, —S—, —Se—, —N═, —NR$^i$—, —SiR$^j$R$^k$—, and —GeR$^l$R$^m$— to form a ring. Herein, R$^g$ to R$^m$ may independently be hydrogen, a substituted or unsubstituted C1 to C30 alkyl group, a substituted or unsubstituted C6 to C30 aryl group, a substituted or unsubstituted C3 to C30 heteroaryl group, a substituted or unsubstituted C1 to C6 alkoxy group, a halogen, or a cyano group.

In some example embodiments, the p-type semiconductor represented by Chemical Formula 1 may be for example represented by Chemical Formula 1B.

[Chemical Formula 1B]

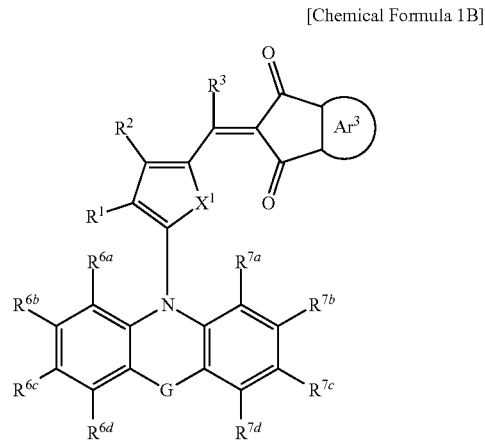

In Chemical Formula 1B,

X$^1$ may be Se, Te, O, S, SO, or SO$_2$,

Ar$^3$ may be a substituted or unsubstituted C6 to C30 arylene group, a substituted or unsubstituted C3 to C30 heterocyclic group, or a fused ring of the foregoing two or more, R$^1$ to R$^3$ may independently be one of hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heteroaryl group, a halogen, a cyano group, a cyano-containing group, and a combination thereof, G may be one of a single bond, —O—, —S—, —Se—, —N═, —(CR$^f$R$^g$)$_k$—, —NR$^h$—, —SiR$^i$R$^j$—, —GeR$^k$R$^l$—, —(C(R$^m$)═C(R$^n$))—, and SnR$^o$R$^p$, wherein R$^f$, R$^g$, R$^h$, R$^i$, R$^j$, R$^k$, R$^l$, R$^m$, R$^n$, R$^o$, and R$^p$ may independently be one of hydrogen, a halogen, a substituted or unsubstituted C1 to C10 alkyl group, a substituted or unsubstituted C1 to C10 alkoxy group, and a substituted or unsubstituted C6 to C12 aryl group, R$^f$ and R$^g$, R$^i$ and R$^j$, R$^k$ and R$^l$, R$^m$ and R$^n$, and R$^o$ and R$^p$ may independently be present alone or may be linked with each other to provide a ring, and k may be 1 or 2, R$^{6a}$ to R$^{6d}$ and R$^{7a}$ to R$^{7d}$ may independently be one of hydrogen, a substituted or unsubstituted C1 to C30 alkyl group, a substituted or unsubstituted C6 to C30 aryl group, a substituted or unsubstituted C3 to C30 heteroaryl group, a halogen, a cyano group, a cyano-containing group, and a combination thereof, R$^{6a}$ to R$^{6d}$ may independently be present alone or adjacent two thereof may be linked with each other to form a fused ring, and R$^{7a}$ to R$^{7d}$ may independently be present alone or adjacent two thereof may be linked with each other to form a fused ring.

In some example embodiments, Ar3 of Chemical Formula 1B may be benzene, naphthylene, anthracene, thiophene, selenophene, tellurophene, pyridine, pyrimidine, or a fused ring of the foregoing two or more.

The n-type semiconductor may be for example fullerene or a fullerene derivative, but is not limited thereto.

The photoelectric conversion layer 30 may be an intrinsic layer (an I layer) wherein the p-type semiconductor and the n-type semiconductor are mixed as a bulk heterojunction. Herein, the p-type semiconductor and the n-type semiconductor may be mixed in a volume ratio of about 1:9 to about 9:1, for example about 2:8 to about 8:2, about 3:7 to about 7:3, about 4:6 to about 6:4, or about 5:5.

The photoelectric conversion layer 30 may be a bilayer including a p-type layer including the p-type semiconductor and an n-type layer including the n-type semiconductor. Herein, a thickness ratio of the p-type layer and the n-type layer may be about 1:9 to about 9:1, for example about 2:8 to about 8:2, about 3:7 to about 7:3, about 4:6 to about 6:4, or about 5:5.

The photoelectric conversion layer 30 may further include a p-type layer and/or an n-type layer in addition to the intrinsic layer. The p-type layer may include the p-type semiconductor and the n-type layer may include the n-type semiconductor. In some example embodiments, they may be included in various combinations of p-type layer/I layer, I layer/n-type layer, p-type layer/I layer/n-type layer, and the like.

The inorganic nanolayer 40 may be disposed between the first electrode 10 and the photoelectric conversion layer 30 and may be for example in contact with the first electrode 10. As shown in FIG. 1, a surface 10s of the first electrode 10 that faces the photoelectric conversion layer 30 may be covered by the inorganic nanolayer 40. In some example embodiments, one surface of the inorganic nanolayer 40 may be in contact with the first electrode 10 and another, opposite surface of the inorganic nanolayer 40 may be in contact with the photoelectric conversion layer 30. It will be understood that, in some example embodiments, the inorganic nanolayer 40 may not be in contact with the first electrode 10.

The inorganic nanolayer 40 may be a very thin film of a several nanometers in thickness and may have a thickness of, for example, less than or equal to about 5 nm, less than or equal to about 3 nm, or less than or equal to about 2 nm. The inorganic nanolayer 40 may have, for example a thickness of about 1 nm to about 5 nm, about 1 nm to about 3 nm, or about 1 nm to about 2 nm.

The inorganic nanolayer 40 may include an inorganic material having a lower work function than the first electrode 10. In some example embodiments, a work function of the inorganic nanolayer 40 may be less than a work function of the first electrode 10 by about 0.5 eV or greater. Restated, a difference between the work function of the conductor (e.g., the transparent conductor or the reflective conductor) of the first electrode 10 and the effective work function at the surface 10s of the first electrode 10 facing the photoelectric conversion layer 30 may be greater than or equal to about 0.5 eV. In some example embodiments, the work function of the first electrode 10 (e.g., the work function of the conductor (e.g., transparent conductor or reflective conductor) of the first electrode 10) may be greater than or equal to about 4.5 eV and the work function of the inorganic nanolayer 40 may be less than or equal to about 4.0 eV. In some example embodiments, the work function of the first electrode 10 may be greater than or equal to about 4.5 eV and the work function of the inorganic nanolayer 40 may be less than or equal to about 3.5 eV. In some example embodiments, the work function of the first electrode 10 may be greater than or equal to about 4.5 eV and the work function of the inorganic nanolayer 40 may be less than or equal to about 3.0 eV. In some example embodiments, the work function of the first electrode 10 may be greater than or equal to about 4.5 eV and the work function of the inorganic nanolayer 40 may be less than or equal to about 2.8 eV. In some example embodiments, the work function of the first electrode 10 may be about 4.5 eV to about 5.0 eV and the work function of the inorganic nanolayer 40 may be about 1.5 eV to about 4.0 eV, about 1.5 eV to about 3.5 eV, about 1.5 eV to about 3.0 eV, or about 1.5 eV to about 2.8 eV.

In some example embodiments, the inorganic nanolayer 40 may be made of a material which satisfies the above-described work function and simultaneously may be formed by thermal evaporation. Since the inorganic nanolayer 40 is formed by thermal evaporation as described above, it is possible to prevent the photoelectric conversion layer 30 from being thermally and physically damaged in its formation process and/or subsequent process of the inorganic nanolayer 40, and thus to prevent its performance from being deteriorated due to degradation of the photoelectric conversion layer 30, thereby improving the performance of the photoelectric conversion device 100.

An inorganic material that may satisfy such characteristics, and thus an inorganic material included in the inorganic nanolayer 40, may include, in some example embodiments, a lanthanide element, calcium (Ca), potassium (K), aluminum (Al), or an alloy thereof. The lanthanide element may include, for example ytterbium (Yb).

As described above, the inorganic nanolayer 40 may be in contact with the surface of the first electrode 10 between the first electrode 10 and the photoelectric conversion layer 30, and it may have a thin thickness compared with the first electrode 10. Accordingly, the inorganic nanolayer 40 may function as a surface-treatment layer of the first electrode 10 on the surface of the first electrode 10 facing the photoelectric conversion layer 30 and may control an effective work function of the first electrode 10 on the surface of the first electrode 10 facing the photoelectric conversion layer 30. Herein, the effective work function may be a work function at the interface of the two layers in a structure where the two layers having different electrical characteristics are in contact with each other. The effective work function of the first electrode 10 at the interface of the first electrode 10 and the photoelectric conversion layer 30 may be controlled by the very-thin inorganic nanolayer 40 and may be, in some example embodiments, a combined work function of the first electrode 10 and the inorganic nanolayer 40.

In some example embodiments, the effective work function on the surface of the first electrode 10 facing the photoelectric conversion layer 30 may be different from the work function of the conductor (e.g., the transparent conductor or the reflective conductor) of the first electrode 10 based on the influences of the inorganic nanolayer 40. In some example embodiments, the effective work function on the surface of the first electrode 10 facing the photoelectric conversion layer 30 may be less than the work function of the conductor (e.g., the transparent conductor or the reflective conductor) of the first electrode 10. The effective work function on the surface of the first electrode 10 facing the photoelectric conversion layer 30 may be the same as the work function of the inorganic nanolayer 40 or may be a medium value between the work function of the inorganic nanolayer 40 and the work function of the first electrode 10.

In some example embodiments, the work function of the conductor (e.g., transparent conductor or reflective conductor) of the first electrode 10 may be greater than or equal to about 4.5 eV and an effective work function on ("at") the surface of the first electrode 10 may be less than or equal to about 4.0 eV. In some example embodiments, the work function of the conductor (e.g., transparent conductor or reflective conductor) of the first electrode 10 may be greater than or equal to about 4.5 eV and the effective work function on ("at") the surface of the first electrode 10 may be less than or equal to about 3.5 eV. In some example embodiments, the work function of the conductor (e.g., the transparent conductor or the reflective conductor) of the first electrode 10 may be greater than or equal to about 4.5 eV, the effective work function on ("at") the surface 10s of the first electrode 10 facing the photoelectric conversion layer 30 may be less than or equal to about 3.0 eV. In some example embodiments, the work function of the conductor (e.g., transparent conductor or reflective conductor) of the first electrode 10 may be greater than or equal to about 4.5 eV and the effective work function on ("at") the surface of the first electrode 10 may be less than or equal to about 2.8 eV. In some example embodiments, the work function of the conductor (e.g., transparent conductor or reflective conductor) of the first electrode 10 may be about 4.5 eV to about 5.0 eV and the effective work function on ("at") the surface of the first electrode 10 may be about 1.5 eV to about 4.0 eV, about 1.5 eV to about 3.5 eV, about 1.5 eV to about 3.0 eV, or about 1.5 eV to about 2.8 eV.

By lowering the work function on ("at") the surface of the first electrode 10 facing the photoelectric conversion layer 30 as described above, extraction of charges (e.g., electrons) from the photoelectric conversion layer 30 and moving to the first electrode 10 may be further facilitated, and remaining charge carriers may be further reduced to show higher charge extraction efficiency, thereby improving the performance of the photoelectric conversion device 100.

The photoelectric conversion device 100 may further include an anti-reflection layer (not shown) on one surface of the first electrode 10 or the second electrode 20. The anti-reflection layer is disposed at a light incidence side and lowers reflectance of light of incident light and thereby light absorbance is further improved, thereby improving performance of an organic complementary metal-oxide-semiconductor (CMOS) image sensor that includes the photoelectric conversion device 100. In some example embodiments, when light is incident to the first electrode 10, the anti-reflection layer may be disposed on one surface of the first electrode 10, and when light is incident to the second electrode 20, anti-reflection layer may be disposed on one surface of the second electrode 20.

The anti-reflection layer may include, for example a material having a refractive index of about 1.6 to about 2.5 and may include for example at least one of metal oxide, metal sulfide, and an organic material having a refractive index within the ranges. The anti-reflection layer may include, for example a metal oxide such as aluminum-containing oxide, molybdenum-containing oxide, tungsten-containing oxide, vanadium-containing oxide, rhenium-containing oxide, niobium-containing oxide, tantalum-containing oxide, titanium-containing oxide, nickel-containing oxide, copper-containing oxide, cobalt-containing oxide, manganese-containing oxide, chromium-containing oxide, tellurium-containing oxide, or a combination thereof; metal sulfide such as zinc sulfide; or an organic material such as an amine derivative, but is not limited thereto.

In the photoelectric conversion device 100, when light enters from the first electrode 10 or the second electrode 20 and the photoelectric conversion layer 30 absorbs light in a particular (or, alternatively, predetermined) wavelength spectrum of light, excitons may be produced thereinside. The excitons are separated into holes and electrons in the photoelectric conversion layer 30, and the separated holes are transported to an anode that is one of the first electrode 10 and the second electrode 20 and the separated electrons are transported to the cathode that is the other of the first electrode 10 and the second electrode 20 so as to flow a current.

Hereinafter, a photoelectric conversion device according to some example embodiments is described.

Figure 2:
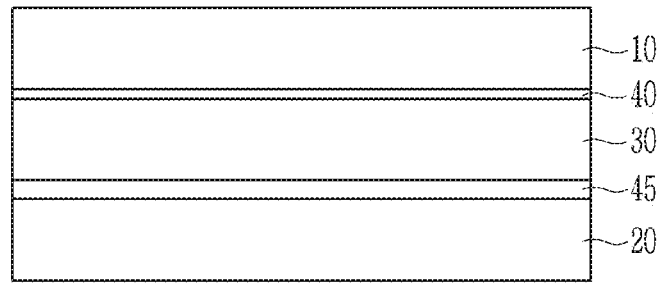
FIG. 2 is a cross-sectional view showing a photoelectric conversion device according to some example embodiments.

FIG. 2 is a cross-sectional view showing a photoelectric conversion device according to some example embodiments.

Referring to FIG. 2, a photoelectric conversion device 200 according to some example embodiments includes a first electrode 10, a second electrode 20, a photoelectric conversion layer 30, and an inorganic nanolayer 40.

However, the photoelectric conversion device 200 according to some example embodiments includes a charge auxiliary layer 45 between the second electrode 20 and the photoelectric conversion layer 30. The charge auxiliary layer 45 may enhance efficiency by facilitating movement of charges (e.g., holes) separated from the photoelectric conversion layer 30.

The charge auxiliary layer 45 may include, for example an organic material, an inorganic material, or an organic/inorganic material. The organic material may be an organic compound having hole or electron characteristics and the inorganic material may be, for example metal oxide such as molybdenum oxide, tungsten oxide, or nickel oxide.

The charge auxiliary layer 45 may include for example a visible light non-absorbing material that does not absorb light in a visible region substantially, for example a visible light non-absorbing organic material.

In some example embodiments, the visible light non-absorbing material may be a compound represented by Chemical Formula 2A or 2B but is not limited thereto.

[Chemical Formula 2A]

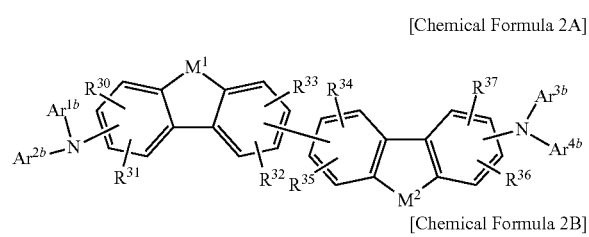

[Chemical Formula 2B]

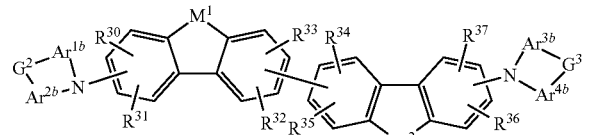

In Chemical Formula 2A or 2B, $M^1$ and $M^2$ may independently be $CR''R^o$, $SiR^pR^q$, $NR^r$, O, S, Se, or Te, $Ar^{1b}$, $Ar^{2b}$, $Ar^{3b}$, and $Ar^{4b}$ may independently be a substituted or unsubstituted C6 to C30 aryl group or a substituted or unsubstituted C3 to C30 heteroaryl group, $G^2$ and $G^3$ may independently be a single bond, $-(CR^sR^t)_{n3}-$, $-O-$, $-S-$, $-Se-$, $-N=$, $-NR^u-$, $-SiR^vR^w-$, or $-GeR^xR^y-$, wherein n3 is 1 or 2, and $R^{30}$ to $R^{37}$ and $R^n$ to $R^y$ may independently be hydrogen, a substituted or unsubstituted C1 to C30 alkyl group, a substituted or unsubstituted C6 to C30 aryl group, a substituted or unsubstituted C3 to C30 heterocyclic group, a substituted or unsubstituted C1 to C6 alkoxy group, a halogen, or a cyano group.

In some example embodiments, the visible light non-absorbing material may be a compound represented by Chemical Formula 2A-1 or 2B-1, but is not limited thereto.

[Chemical Formula 2A-1]

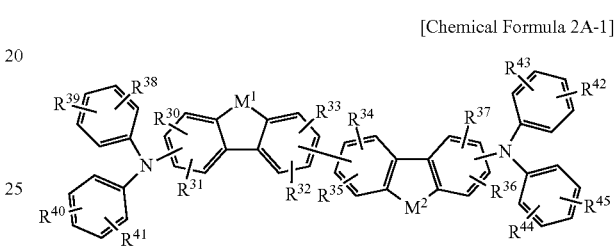

[Chemical Formula 2B-1]

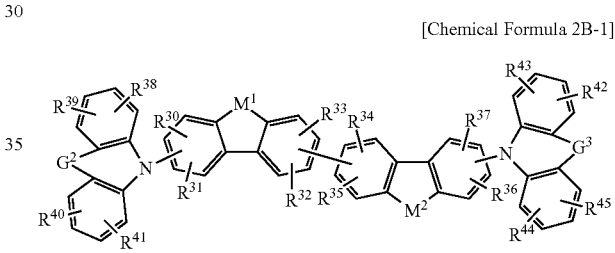

In Chemical Formula 2A-1 or 2B-1, $M^1$, $M^2$, $G^2$, $G^3$, and $R^{30}$ to $R^{37}$ are the same as described above, and $R^{38}$ to $R^{45}$ may independently be hydrogen, a substituted or unsubstituted C1 to C30 alkyl group, a substituted or unsubstituted C6 to C30 aryl group, a substituted or unsubstituted C3 to C30 heteroaryl group, a substituted or unsubstituted C1 to C6 alkoxy group, a halogen, or a cyano group.

In some example embodiments, the visible light non-absorbing material may be a compound represented by Chemical Formula 2A-1a or 2B-1a but is not limited thereto.

[Chemical Formula 2A-1a]

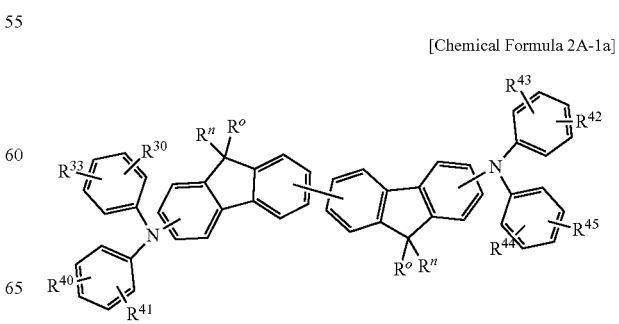

[Chemical Formula 2B-1a]

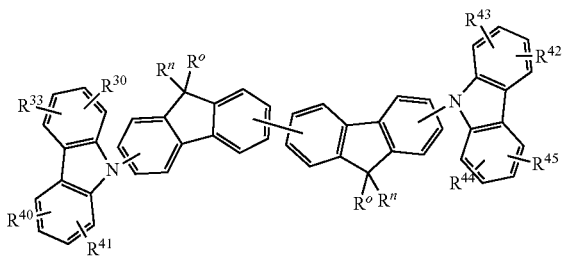

In Chemical Formula 2A-1a or 2B-1a, $R^{38}$ to $R^{45}$ and $R^o$, and $R^n$ are the same as described above.

The photoelectric conversion devices 100 and 200 may be applied to ("included in") various electronic devices, for example a solar cell, an organic sensor, a photodetector, and a photosensor, but is not limited thereto.

The photoelectric conversion devices 100 and 200 may be for example applied to an organic sensor, for example an image sensor as an example of the organic sensor.

Hereinafter, an example of an image sensor including the photoelectric conversion device will be described with reference to the drawings. As an example of an image sensor, an organic CMOS image sensor is described.

Figure 3:
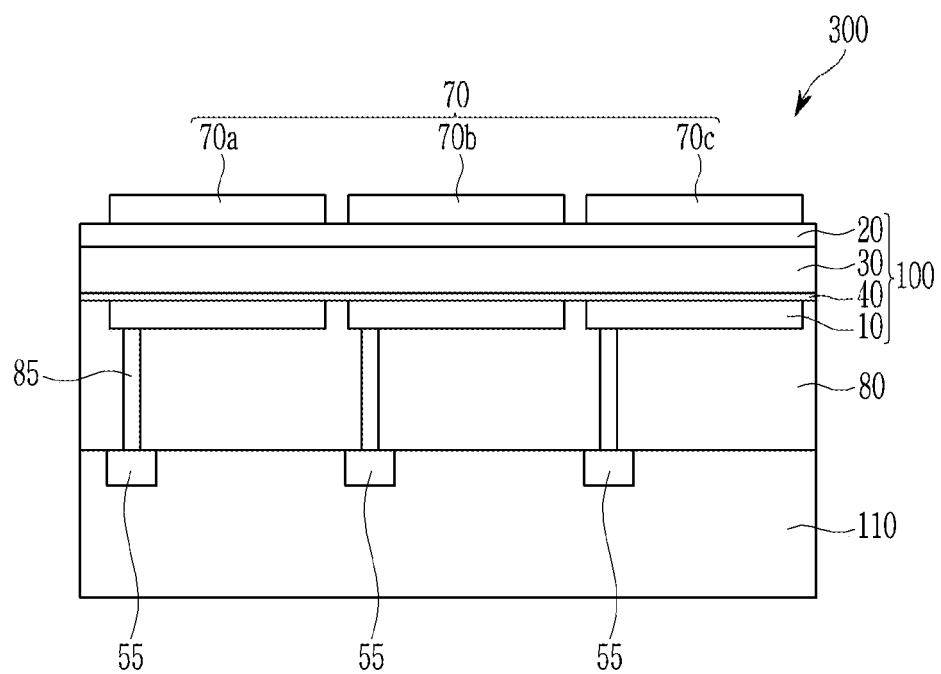
FIG. 3 is a cross-sectional view showing an example of an organic CMOS image sensor according to some example embodiments.

FIG. 3 is a cross-sectional view showing an example of an organic CMOS image sensor according to some example embodiments.

Referring to FIG. 3, an organic CMOS image sensor 300 according to some example embodiments includes a semiconductor substrate 110, an insulation layer 80, a photoelectric conversion device 100, and a color filter layer 70.

The semiconductor substrate 110 may be a silicon substrate, and is integrated with the transmission transistor (not shown) and the charge storage 55. The transmission transistor and/or the charge storage 55 may be integrated in each pixel.

A metal wire (not shown) and a pad (not shown) are formed on the semiconductor substrate 110. In order to decrease signal delay, the metal wire and pad may be made of a metal having low resistivity, for example, aluminum (Al), copper (Cu), silver (Ag), and alloys thereof, but are not limited thereto.

The insulation layer 80 is formed on the metal wire and the pad. The insulation layer 80 may be made of an inorganic insulating material such as a silicon oxide and/or a silicon nitride, or a low dielectric constant (low K) material such as SiC, SiCOH, SiCO, and SiOF. The insulation layer 80 has a trench 85 exposing the charge storage 55. The trench 85 may be filled with fillers.

The photoelectric conversion device 100 is formed on the insulation layer 80. The photoelectric conversion device 100 includes a first electrode 10, an inorganic nanolayer 40, a photoelectric conversion layer 30, and a second electrode 20 as described above. Details thereof are the same as described above.

A color filter layer 70 is formed on the photoelectric conversion device 100. The color filter layer 70 includes a blue filter 70a formed in a blue pixel, a red filter 70b formed in a red pixel, and a green filter 70c formed in a green pixel. However, the color filter layer 70 may include a cyan filter, a magenta filter, and/or a yellow filter instead of the above color filters or may further include them in addition to the above color filters. It will be understood that a color filter is configured to selectively transmit a particular wavelength spectrum of light. Where a color filter overlaps a photo-sensing device, the color filter may be configured to selectively transmit a particular wavelength spectrum of light to a photo-sensing device so that the photo-sensing device is configured to absorb, and convert into electrical signals, the particular wavelength spectrum of light.

Focusing lens (not shown) may be further formed on the color filter layer 70. The focusing lens may control a direction of incident light and gather the light in one region. The focusing lens may have a shape of, for example, a cylinder or a hemisphere, but is not limited thereto.

Even though the structure including the stacked photoelectric conversion device 100 of FIG. 1 is for example illustrated in FIG. 3, structures in which the photoelectric conversion device 200 of FIG. 2 are stacked may be applied in the same manner.

Figure 4:
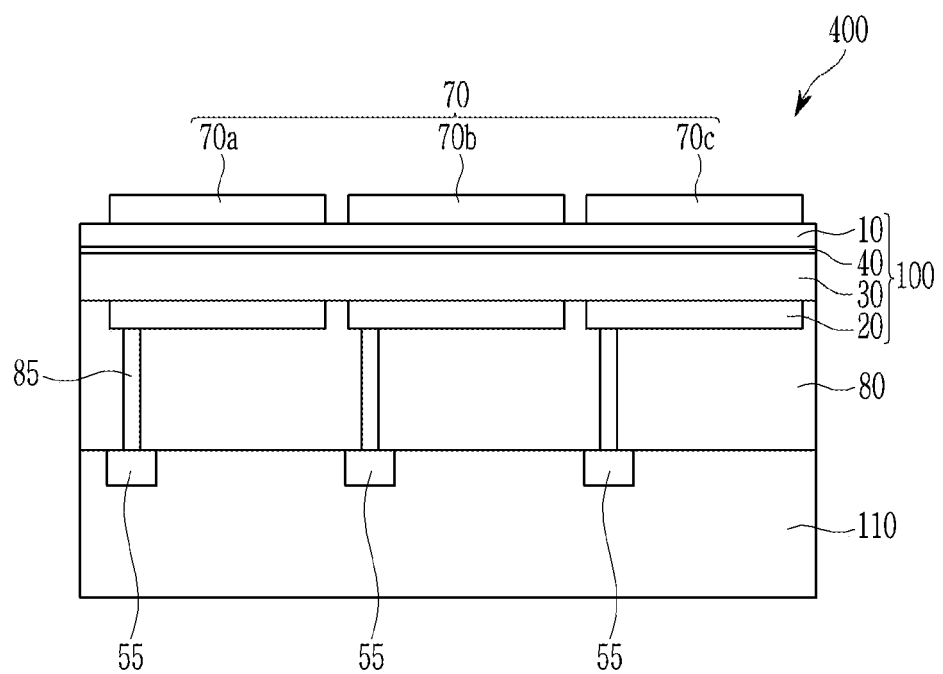
FIG. 4 is a cross-sectional view showing another example of an organic CMOS image sensor according to some example embodiments.

FIG. 4 is a cross-sectional view showing another example of an organic CMOS image sensor according to some example embodiments.

Referring to FIG. 4, an organic CMOS image sensor 400 according to some example embodiments includes a semiconductor substrate 110 integrated with a transmission transistor (not shown) and a charge storage 55, an insulation layer 80, a photoelectric conversion device 100, and a color filter layer 70.

However, in the organic CMOS image sensor 400 according to some example embodiments, the positions of the first electrode 10 and the second electrode 20 of the photoelectric conversion device 100 are changed. That is, the first electrode 10 may be a light-receiving electrode.

Figure 6:
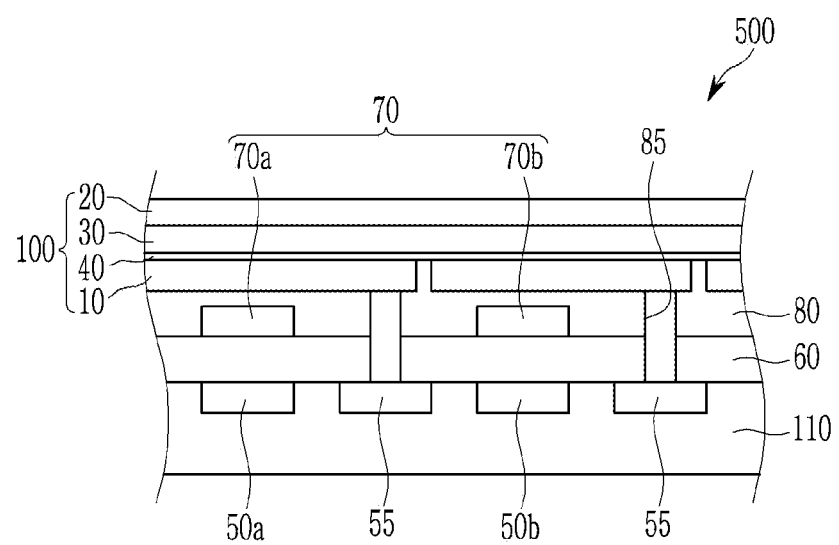
FIG. 6 is a cross-sectional view showing an example of the organic CMOS image sensor of FIG. 5.

Even though the structure including the stacked photoelectric conversion device 100 of FIG. 1 is for example illustrated in FIG. 6, structures in which the photoelectric conversion device 200 of FIG. 2 are stacked may be applied in the same manner.

Figure 5:
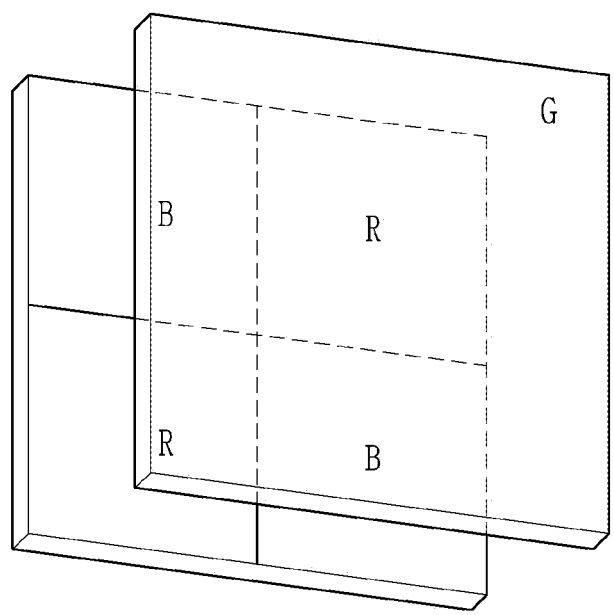
FIG. 5 is a schematic top plan view of an organic CMOS image sensor according to some example embodiments.

FIG. 5 is a schematic top plan view of an organic CMOS image sensor according to some example embodiments and FIG. 6 is a cross-sectional view showing one example of the organic CMOS image sensor of FIG. 5.

Referring to FIGS. 5 and 6, an organic CMOS image sensor 500 according to some example embodiments includes a semiconductor substrate 110 integrated with photo-sensing devices 50a and 50b, a transmission transistor (not shown), and a charge storage 55, a lower insulation layer 60, a color filter layer 70, an upper insulation layer 80, and a photoelectric conversion device 100.

The semiconductor substrate 110 may be a silicon substrate and is integrated with the photo-sensing devices 50a and 50b, the transmission transistor (not shown), and the charge storage 55. The photo-sensing devices 50a and 50b may be photodiodes.

The photo-sensing devices 50a and 50b, the transmission transistor, and/or the charge storage 55 may be integrated in each pixel, and as shown in the drawing, the photo-sensing devices 50a and 50b may be respectively included in a blue pixel and a red pixel and the charge storage 55 may be included in a green pixel.

The photo-sensing devices 50a and 50b sense light, the information sensed by the photo-sensing devices may be transferred by the transmission transistor, the charge storage 55 is electrically connected to the photoelectric conversion device 100 that will be described later, and the information of the charge storage 55 may be transferred by the transmission transistor.

A metal wire (not shown) and a pad (not shown) are formed on the semiconductor substrate 110. In order to decrease signal delay, the metal wire and pad may be made of a metal having low resistivity, for example, aluminum (Al), copper (Cu), silver (Ag), and alloys thereof, but are not limited thereto. However, it is not limited to the structure, and the metal wire and pad may be disposed under the photo-sensing devices 50a and 50b.

The lower insulation layer 60 is formed on the metal wire and the pad. The lower insulation layer 60 may be made of an inorganic insulating material such as a silicon oxide and/or a silicon nitride, or a low dielectric constant (low K) material such as SiC, SiCOH, SiCO, and SiOF. The lower insulation layer 60 has a trench exposing the charge storage 55. The trench may be filled with fillers.

A color filter layer 70 is formed on the lower insulation layer 60. The color filter layer 70 includes a blue filter 70a formed in a blue pixel and a red filter 70b formed in a red pixel. In some example embodiments, a green filter is not included, but a green filter may be further included.

The upper insulation layer 80 is formed on the color filter layer 70. The upper insulation layer 80 may eliminate a step caused by the color filter layer 70 and smoothen the surface. The upper insulation layer 80 and the lower insulation layer 60 may include a contact hole (not shown) exposing a pad, and a through-hole 85 ("trench") exposing the charge storage 55 of the green pixel.

The photoelectric conversion device 100 is formed on the upper insulation layer 80. The photoelectric conversion device 100 includes the first electrode 10, the inorganic nanolayer 40, the photoelectric conversion layer 30, and the second electrode 20 as described above. Details are the same as described above.

Focusing lens (not shown) may be further formed on the photoelectric conversion device 100. The focusing lens may control a direction of incident light and gather the light in one region. The focusing lens may have a shape of, for example, a cylinder or a hemisphere, but is not limited thereto.

Even though the structure including the stacked photoelectric conversion device 100 of FIG. 1 is for example illustrated in FIG. 6, a structure in which the photoelectric conversion device 200 of FIG. 2 is stacked may be applied in the same manner.

Figure 7:
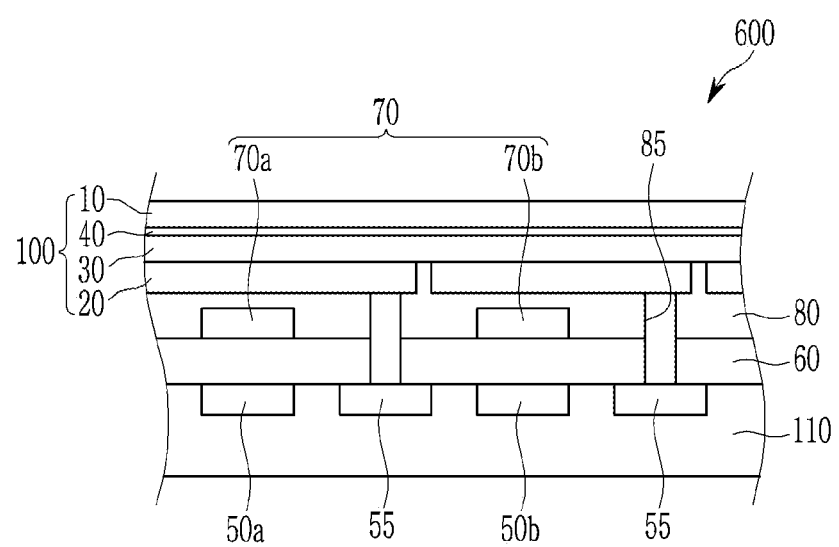
FIG. 7 is a cross-sectional view showing another example of an organic CMOS image sensor.

FIG. 7 is a cross-sectional view showing another example of an organic CMOS image sensor.

Referring to FIG. 7, the organic CMOS image sensor 600 according to some example embodiments includes a semiconductor substrate 110 integrated with photo-sensing devices 50a and 50b, a transmission transistor (not shown), and a charge storage 55, a lower insulation layer 60, a color filter layer 70, an upper insulation layer 80, and a photoelectric conversion device 100.

However, in the organic CMOS image sensor 600 according to some example embodiments, the positions of the first electrode 10 and the second electrode 20 are changed. That is, the first electrode 10 may be a light-receiving electrode.

Even though the structure including the stacked photoelectric conversion device 100 of FIG. 1 is for example illustrated in FIG. 7, a structure in which the photoelectric conversion device 200 of FIG. 2 is stacked may be applied in the same manner.

Figure 8:
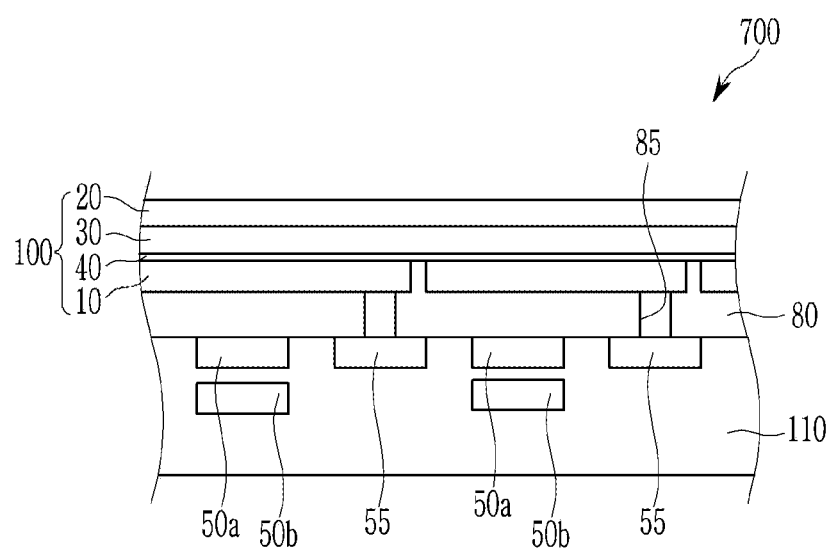
FIG. 8 is a cross-sectional view showing another example of an organic CMOS image sensor.

FIG. 8 is a cross-sectional view showing another example of an organic CMOS image sensor.

An organic CMOS image sensor 700 according to some example embodiments includes a semiconductor substrate 110 integrated with photo-sensing devices 50a and 50b, transmission transistor (not shown), and a charge storage 55, an upper insulation layer 80 having a through-hole 85, and a photoelectric conversion device 100.

However, in the organic CMOS image sensor 700 according to some example embodiments, the photo-sensing devices 50a and 50b are stacked in a vertical direction and the color filter layer 70 is omitted. The photo-sensing devices 50a and 50b are electrically connected to charge storage (not shown) and may be transferred by the transmission transistor. The photo-sensing devices 50a and 50b may selectively absorb light in each wavelength spectrum of light depending on a stack depth.

Even though the structure including the stacked photoelectric conversion device 100 of FIG. 1 is for example illustrated in FIG. 8, a structure in which the photoelectric conversion device 200 of FIG. 2 is stacked may be applied in the same manner.

Figure 9:
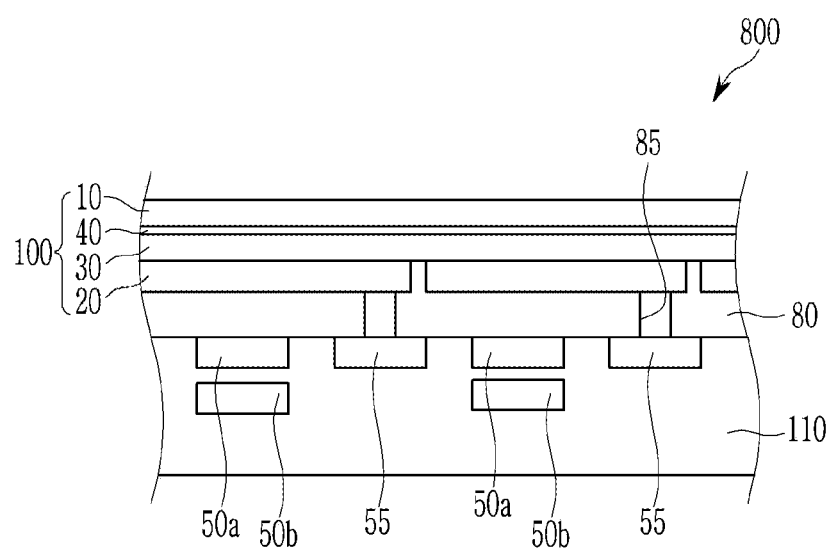
FIG. 9 is a cross-sectional view showing another example of an organic CMOS image sensor.

FIG. 9 is a cross-sectional view showing another example of an organic CMOS image sensor.

Referring to FIG. 9, an organic CMOS image sensor 800 according to some example embodiments includes a semiconductor substrate 110 integrated with photo-sensing devices 50a and 50b, a transmission transistor (not shown), and a charge storage 55, an upper insulation layer 80 having a through-hole 85, and a photoelectric conversion device 100. However, in the organic CMOS image sensor 800 according to some example embodiments, the positions of the first electrode 10 and the second electrode 20 are changed. That is, the first electrode 10 may be a light-receiving electrode.

Even though the structure including the stacked photoelectric conversion device 100 of FIG. 1 is for example illustrated in FIG. 9, a structure in which the photoelectric conversion device 200 of FIG. 2 is stacked may be applied in the same manner.

Figure 10:
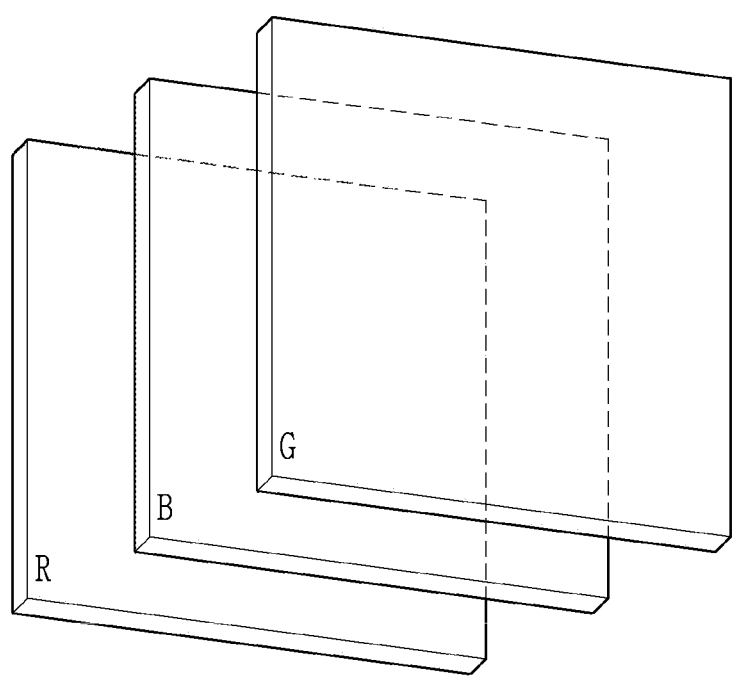
FIG. 10 is a schematic top plan view of an organic CMOS image sensor according to some example embodiments.
Figure 11:
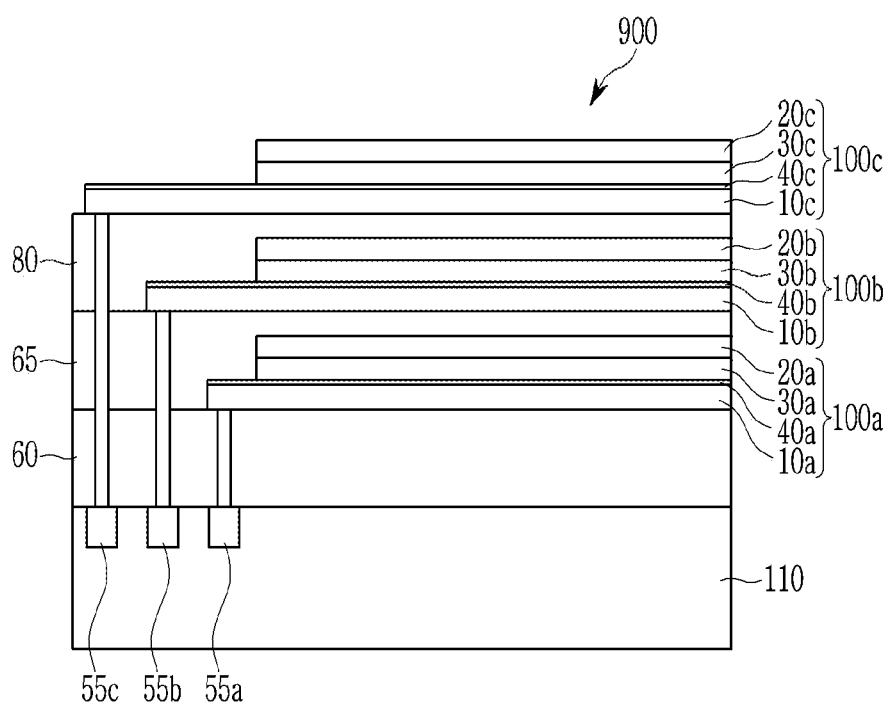
FIG. 11 is a cross-sectional view of the organic CMOS image sensor of FIG. 10.

FIG. 10 is a schematic top plan view of an organic CMOS image sensor according to some example embodiments and FIG. 11 is a cross-sectional view of the organic CMOS image sensor of FIG. 10.

An organic CMOS image sensor 900 according to some example embodiments has a structure in which a green photoelectric conversion device selectively absorbing light in a green wavelength spectrum of light, a blue photoelectric conversion device selectively absorbing light in a blue wavelength spectrum of light, and a red photoelectric conversion device selectively absorbing light in a red wavelength spectrum of light are stacked.

The organic CMOS image sensor 900 according to some example embodiments includes a semiconductor substrate 110, a lower insulation layer 60, an intermediate insulation layer 65, an upper insulation layer 80, a first photoelectric conversion device 100a, a second photoelectric conversion device 100b, and a third photoelectric conversion device 100c.

The semiconductor substrate 110 may be a silicon substrate and is integrated with the transmission transistor (not shown) and the charge storage 55a, 55b, and 55c.

A metal wire (not shown) and a pad (not shown) are formed on the semiconductor substrate 110, and the lower insulation layer 60 is formed on the metal wire and the pad.

The first photoelectric conversion device 100a is formed on the lower insulation layer 60.

The first photoelectric conversion device 100a includes a first electrode 10a and a second electrode 20a facing each other, and a photoelectric conversion layer 30a and an inorganic nanolayer 40a disposed between the first electrode 10a and the second electrode 20a. The first electrode 10a, the second electrode 20a, the photoelectric conversion layer 30, and the inorganic nanolayer 40a are the same as described above, and the photoelectric conversion layer 30a may selectively absorb light in one of red, blue, and green wavelength spectra of light. In some example embodiments, the first photoelectric conversion device 100a may be a red photoelectric conversion device.

The intermediate insulation layer 65 may be formed on the first photoelectric conversion device 100a.

The second photoelectric conversion device 100b may be formed on the intermediate insulation layer 65.

The second photoelectric conversion device 100b includes a first electrode 10b and a second electrode 20b, and a photoelectric conversion layer 30b and an inorganic nanolayer 40b between the first electrode 10b and the second electrode 20b. The first electrode 10b, the second electrode 20b, the photoelectric conversion layer 30b, and the inorganic nanolayer 40b are the same as described above, and the photoelectric conversion layer 30b may selectively absorb light in one of red, blue, and green wavelength spectra of light. In some example embodiments, the first photoelectric conversion device 100b may be a blue photoelectric conversion device.

The upper insulation layer 80 may be formed on the second photoelectric conversion device 100b. The lower insulation layer 60, the intermediate insulation layer 65, and the upper insulation layer 80 have a plurality of a plurality of through-holes exposing the charge storages 55a, 55b, and 55c.

The third photoelectric conversion device 100c is formed on the upper insulation layer 80. The third photoelectric conversion device 100c includes a first electrode 10c and a second electrode 20c facing each other, and a photoelectric conversion layer 30c and an inorganic nanolayer 40c disposed between the first electrode 10c and the second electrode 20c. The first electrode 10c, the second electrode 20c, the photoelectric conversion layer 30c, and the inorganic nanolayer 40c are the same as described above, and the photoelectric conversion layer 30c may selectively absorb light in one of red, blue, and green wavelength spectra of light. In some example embodiments, the third photoelectric conversion device 100c may be a green photoelectric conversion device and may be the photoelectric conversion device 100.

Focusing lens (not shown) may be further formed on the photoelectric conversion device 100c. The focusing lens may control a direction of incident light and gather the light in one region. The focusing lens may have a shape of, in some example embodiments, a cylinder or a hemisphere, but is not limited thereto.

In the drawing, even though as the first photoelectric conversion device 100a, the second photoelectric conversion device 100b, and the third photoelectric conversion device 100c, the photoelectric conversion device 100 of FIG. 1 is for example illustrated, the photoelectric conversion device 200 of FIG. 2 may be applied in the same manner.

In the drawing, the first photoelectric conversion device 100a, the second photoelectric conversion device 100b, and the third photoelectric conversion device 100c are sequentially stacked, but the present disclosure is not limited thereto, and they may be stacked in various orders.

As described above, the first photoelectric conversion device 100a, the second photoelectric conversion device 100b, and the third photoelectric conversion device 100c are stacked, and thus the size of an image sensor may be reduced to realize a down-sized image sensor.

Figure 12:
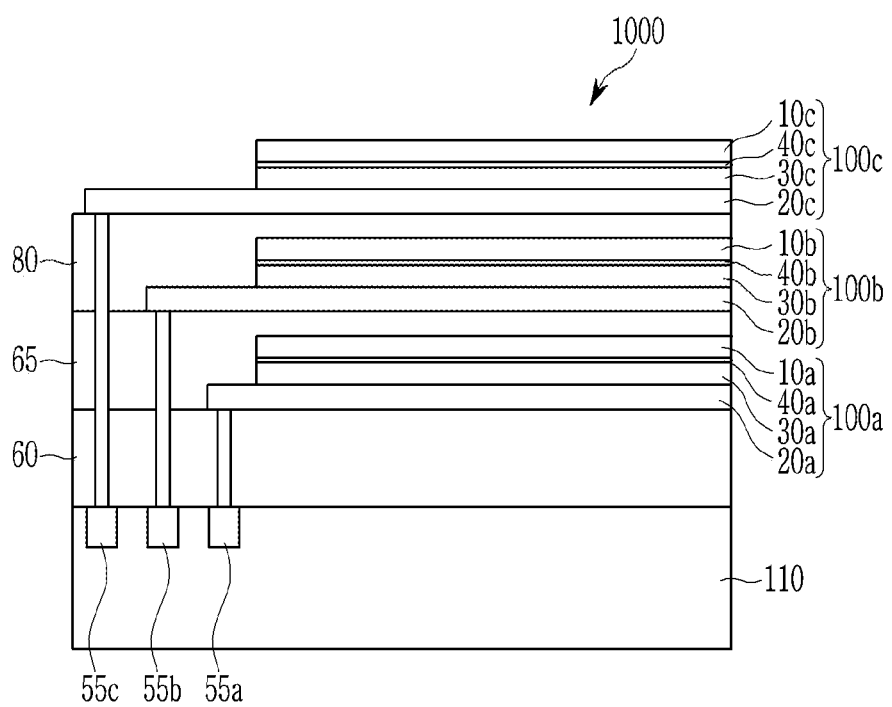
FIG. 12 is a cross-sectional view showing another example of an organic CMOS image sensor

FIG. 12 is a schematic cross-sectional view showing another example of an organic sensor according to some example embodiments.

Referring to FIG. 12, an image sensor 1000 according to some example embodiments includes a semiconductor substrate 110, a lower insulation layer 60, an intermediate insulation layer 65, an upper insulation layer 80, a first photoelectric conversion device 100a, a second photoelectric conversion device 100b, and a third photoelectric conversion device 100c. However, the positions of the first electrode 10 and the second electrode 20 of the first photoelectric conversion device 100a, the second photoelectric conversion device 100b, and the third photoelectric conversion device 100c are changed. That is, the first electrode 10 may be a light-receiving electrode.

The photoelectric conversion device and the organic CMOS image sensor may be applied to various electronic devices, for example a mobile phone or a digital camera, but are not limited thereto.

Figure 13:
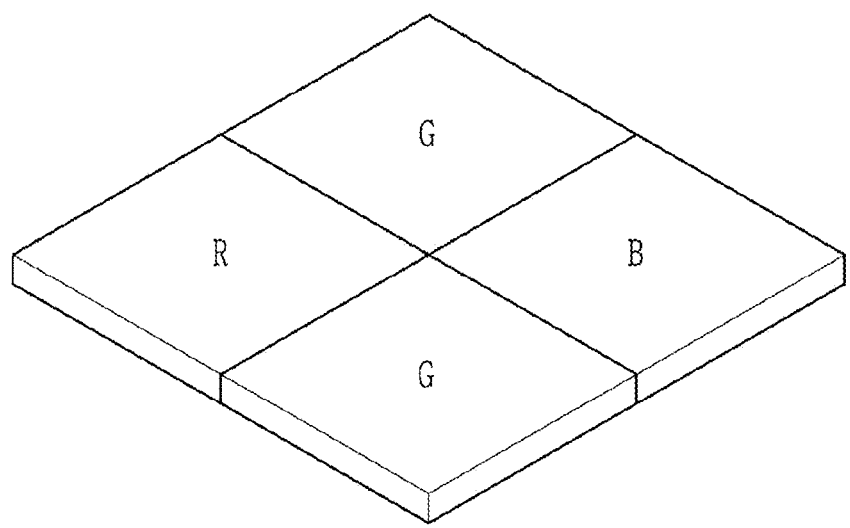
FIG. 13 is a schematic top plan view showing an example of an organic CMOS image sensor according to some example embodiments.
Figure 14:
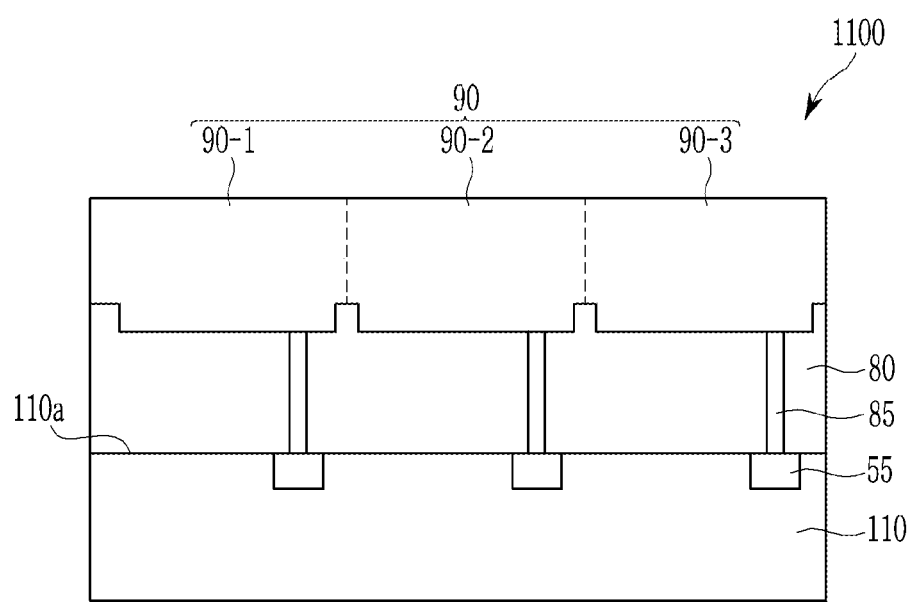
FIG. 14 is a schematic cross-sectional view showing an example of the organic CMOS image sensor of FIG. 13.

FIG. 13 is a schematic top plan view showing an example of an organic CMOS image sensor according to some example embodiments, and FIG. 14 is a schematic cross-sectional view showing an example of the organic CMOS image sensor of FIG. 13.

As shown with reference to FIGS. 13-14, an organic CMOS image sensor 1100 may include a photoelectric conversion device 90 that itself includes a plurality of photoelectric conversion devices 90-1, 90-2, and 90-3 on a semiconductor substrate 110, where the plurality of photoelectric conversion devices 90-1, 90-2, and 90-3 are configured to convert different wavelength spectra of light (e.g., different ones of blue light, green light, or red light) into electric signals, respectively. As shown in FIG. 14, the separate photoelectric conversion devices 90-1 to 90-3 may be horizontally arranged on the semiconductor substrate 110 such that the photoelectric conversion devices 90-1 to 90-3 are partially or entirely overlapped with each other in a direction that extends in parallel with a top surface 110a of the semiconductor substrate 110. As shown each separate photoelectric conversion device 90-1 to 90-3 is connected to a separate charge storage 55 that is integrated into the semiconductor substrate 110 via a separate trench 85.

Each photoelectric conversion device 90-1 to 90-3 of the photoelectric conversion device 90 may be any one of the photoelectric conversion devices 100-400 described herein. In some example embodiments, separate photoelectric conversion devices 90-1 to 90-3 may include different portions of a common, continuous layer that extends continuously between two or more of the photoelectric conversion devices 90-1 to 90-3. In some example embodiments, the photoelectric conversion devices 90-1 to 90-3 may share a common first electrode 10 and a common second electrode 20. In another example, two or more of the photoelectric conversion devices 90-1 to 90-3 may have different photoelectric conversion layers 30 that are configured to absorb different wavelength spectra of incident light. In another example, two or more of the photoelectric conversion devices 90-1 to 90-3 may have different configurations of inorganic nanolayers 40. Other structures of organic CMOS image sensor 1100 may be are the same as one or more of the organic CMOS image sensors described with reference to any of FIGS. 3-12.

Figure 15:
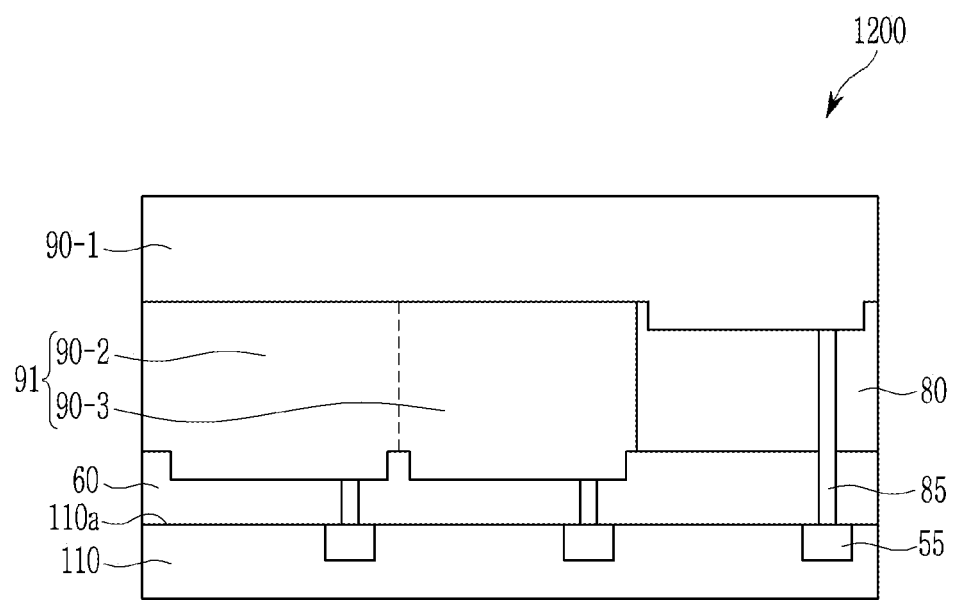
FIG. 15 is a schematic cross-sectional view of an organic CMOS image sensor according to some example embodiments.

FIG. 15 is a schematic cross-sectional view of an organic CMOS image sensor according to some example embodiments.

Referring to FIG. 15, an organic CMOS image sensor 1200 may include a semiconductor substrate 110 and photoelectric conversion devices 90-1 and 91 that are stacked on each other so as to at least partially overlap in a direction extending perpendicular to the top surface 110a of the semiconductor substrate 110, and wherein at least one of the photoelectric conversion devices 90-1 and 91 further includes multiple photoelectric conversion devices 90-2 and 90-3 that are arranged so as to overlap in a direction extending parallel to the top surface 110a of the semiconductor substrate 110, and where the plurality of photoelectric conversion devices 90-1, 90-2, and 90-3 are configured to convert different wavelength spectra of light (e.g., different ones of blue light, green light, or red light) into electric signals, respectively. It will be understood that, in some example embodiments, photoelectric conversion device 90-1 includes multiple, horizontally-arranged photoelectric conversion devices configured to absorb different wavelengths spectra of light while photoelectric conversion device 91 is limited to a single photoelectric conversion device that is configured to absorb a single wavelength spectrum of light. In some example embodiments, including the example embodiments shown in FIG. 15, an entirety of the photoelectric conversion device 91 overlaps a limited portion of the photoelectric conversion device 90-1 in the direction extending perpendicular to the top surface 110a and a remainder portion of the photoelectric conversion device 90-1 that is exposed by the photoelectric conversion device 91 is covered by insulation layer 80. However, it will be understood that in some example embodiments an entirety of the photoelectric conversion device 90-1 overlaps a limited portion of the photoelectric conversion device 91 in the direction extending perpendicular to the top surface 110a. Other structures of organic CMOS image sensor 1200 may be are the same as one or more of the organic CMOS image sensors described with reference to any of FIGS. 3-12.

Figure 16:
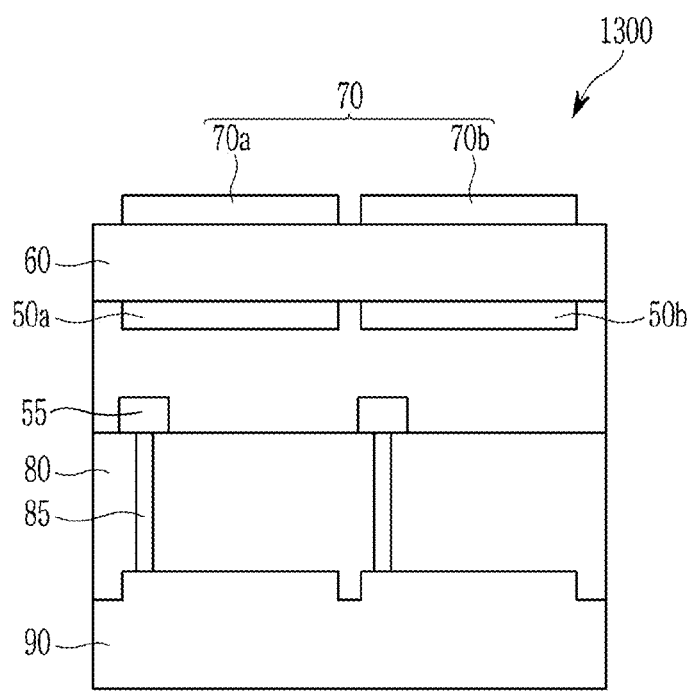
FIG. 16 is a schematic cross-sectional view of an organic CMOS image sensor according to some example embodiments.

FIG. 16 is a schematic cross-sectional view of an organic CMOS image sensor according to some example embodiments.

Referring to FIG. 16, an organic CMOS image sensor 1300 according to some example embodiments includes a semiconductor substrate 110 integrated with photo-sensing devices 50a and 50b, a transmission transistor (not shown) and a charge storage 55, an intermediate insulation layer 65, and a color filter layer 70 on the semiconductor substrate 110, and a photoelectric conversion device 90 under the semiconductor substrate 110. The photoelectric conversion device 90 shown in FIG. 18 may be any of the example embodiments of photoelectric conversion devices described herein. As shown in FIG. 16, the photoelectric conversion device 90 may be on (e.g., above or beneath) the semiconductor substrate 110, such that the color filter layer 70 is distal from the photoelectric conversion device 90 in relation to the photo-sensing devices 50a and 50b. Other structures of organic CMOS image sensor 1300 may be are the same as one or more of the organic CMOS image sensors described with reference to any of FIGS. 3-12.

It will be understood that, where an organic CMOS image sensor includes a photo-sensing device and a photoelectric conversion device, the photo-sensing device and the photoelectric conversion device may be configured to absorb different, first and second wavelength spectra of light and convert said absorbed light into electric signals.

While FIG. 16 illustrates example embodiments where color filters 70a, 70b of a color filter layer overlap separate, respective photo-sensing devices 50a, 50b, it will be understood that in some example embodiments an organic CMOS image sensor may include one or more photo-sensing devices and may omit one or more color filters 70a, 70b overlapping the one or more photo-sensing devices in the direction extending perpendicular to the top surface 110a. Such one or more photo-sensing devices may be configured to sense light having a particular, limited wavelength spectrum of light in the absence of the light being filtered by a color filter prior to being received at the photo-sensing device. Accordingly, it will be understood that, in some example embodiments, the organic CMOS image sensors described herein according to various example embodiments may omit the color filters illustrated in said organic CMOS image sensors.

Figure 17:
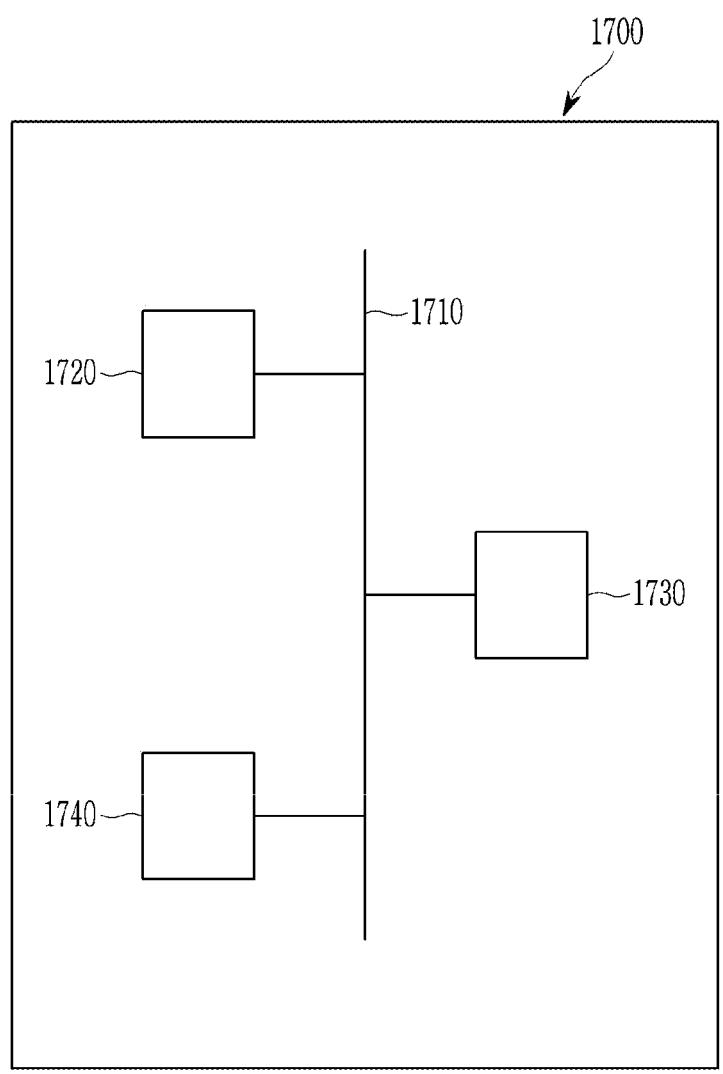
FIG. 17 is a schematic diagram of an electronic device according to some example embodiments.

FIG. 17 is a schematic diagram of an electronic device according to some example embodiments.

As shown in FIG. 17, an electronic device 1700 may include a processor 1720, a memory 1730, and an organic CMOS image sensor 1740 that are electrically coupled together via a bus 1710. The organic CMOS image sensor 1740 may be an organic CMOS image sensor of any of the example embodiments as described herein, and the organic CMOS image sensor included in the organic CMOS image sensor 1740 may include any of the photoelectric conversion devices described herein according to any of the example embodiments of the inventive concepts. The memory 1730, which may be a non-transitory computer readable medium, may store a program of instructions. The processor 1720 may execute the stored program of instructions to perform one or more functions. In some example embodiments, the processor 1720 may be configured to process electric signals generated by the organic CMOS image sensor 1740. The processor 1720 may be configured to generate an output (e.g., an image to be displayed on a display interface) based on processing the electric signals.

Hereinafter, some example embodiments are illustrated in more detail with reference to examples. However, the present disclosure is not limited to the following examples.

Example 1

A 150 nm-thick anode is formed by sputtering ITO on a glass substrate. Subsequently, on the anode, a 5 nm-thick charge auxiliary layer is formed by depositing a compound represented by Chemical Formula A. On the charge auxiliary layer, a 100 nm-thick photoelectric conversion layer is formed by codepositing a p-type semiconductor ($\lambda_{max}$: 545 nm) represented by Chemical Formula B-1 and an n-type semiconductor, fullerene C60, in a volume ratio of 1:1. Subsequently, on the photoelectric conversion layer, a 1.5 nm-thick inorganic nanolayer is formed by thermally depositing Yb (WF: 2.6 eV). On the inorganic nanolayer, a 7 nm-thick cathode is formed by sputtering ITO (WF: 4.7 eV). On the cathode, a 50 nm-thick anti-reflection layer is formed by depositing aluminum oxide ($Al_2O_3$), and then, a glass plate is used for sealing to manufacture a photoelectric conversion device.

[Chemical Formula A]

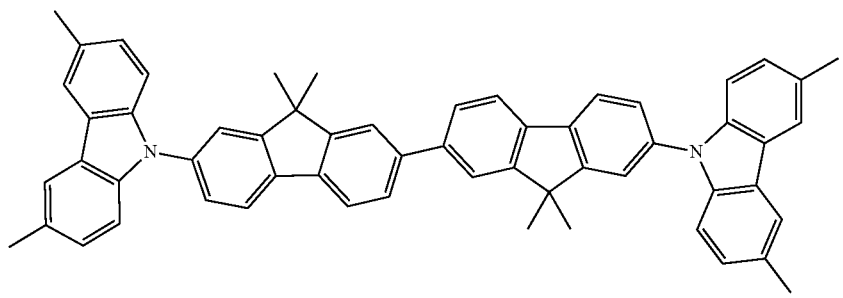

[Chemical Formula B-1]

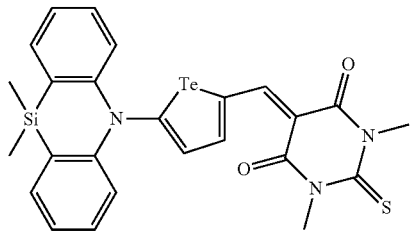

Comparative Example 1

A photoelectric conversion device is manufactured according to the same method as Example 1 except that the inorganic nanolayer is not formed.

Example 2

A photoelectric conversion device is manufactured according to the same method as Example 1 except that the p-type semiconductor and the n-type semiconductor are codeposited in a volume ratio of 1.2:1 to form a 90 nm-thick photoelectric conversion layer.

Comparative Example 2

A photoelectric conversion device is manufactured according to the same method as Example 3 except that the inorganic nanolayer is not formed.

Example 3

A photoelectric conversion device is manufactured according to the same method as Example 1 except that the p-type semiconductor and the n-type semiconductor are codeposited in a volume ratio of 2.5:1 to form an 80 nm-thick photoelectric conversion layer.

Comparative Example 3

A photoelectric conversion device is manufactured according to the same method as Example 4 except that the inorganic nanolayer is not formed.

Evaluation I

Remaining electrons characteristics of the photoelectric conversion devices of Examples and Comparative Examples are evaluated.

The remaining electrons characteristics indicate an amount of charges photoelectrically-converted in one frame but not signal-treated and remain and thus read in the next frame and are evaluated by irradiating light in a wavelength spectrum of light in which a photoelectric conversion occurs into the photoelectric conversion devices according to Examples and Comparative Examples for a particular (or, alternatively, predetermined) time and then, turning the light off, and measuring a current amount per a $10^{-6}$ second unit using a Keithley 2400 equipment.

The results are shown in Tables 1 to 3.

TABLE 1

| | Remaining electrons ($e^-$) | | |
|---|---|---|---|
| | 30 fps | 240 fps | 960 fps |
| Example 1 | 1.3 ± 0.1 | 10.3 ± 1.0 | 18.0 ± 1.8 |
| Comparative Example 1 | 2.6 ± 0.2 | 17.2 ± 2.0 | 36.1 ± 1.8 |

TABLE 2

| | Remaining electrons ($e^-$) | | |
|---|---|---|---|
| | 30 fps | 240 fps | 960 fps |
| Example 2 | 2.7 ± 0.1 | 17.0 ± 1.2 | 40.2 ± 1.5 |
| Comparative Example 2 | 3.5 ± 0.2 | 19.9 ± 2.3 | 51.9 ± 4.5 |

TABLE 3

| | Remaining electrons ($e^-$) | | |
|---|---|---|---|
| | 30 fps | 240 fps | 960 fps |
| Example 3 | 13.7 ± 0.2 | 104.8 ± 1.7 | 251.1 ± 3.3 |
| Comparative Example 3 | 26.4 ± 1.4 | 167.6 ± 2.1 | 356.9 ± 5.3 |

Referring to Tables 1 to 3, the photoelectric conversion devices including the inorganic nanolayer according to Examples show improved remaining electrons characteristics compared with the photoelectric conversion devices including no inorganic nanolayer according to Comparative Examples.

Evaluation II

Photoelectric conversion efficiency of the photoelectric conversion devices according to Examples and Comparative Examples is evaluated.

The photoelectric conversion efficiency (EQE) is evaluated in a wavelength spectrum of light of 400 nm to 720 nm in an Incident Photon to Current Efficiency (IPCE) method. The results are shown in Tables 4 and 5.

TABLE 4

|  | Photoelectric conversion efficiency (EQE, %) |
|---|---|
| Example 1 | 72.3 |
| Comparative Example 1 | 70.7 |

TABLE 5

|  | Photoelectric conversion efficiency (EQE, %) |
|---|---|
| Example 3 | 61.3 |
| Comparative Example 3 | 60.0 |

Referring to Tables 4 and 5, the photoelectric conversion devices according to Examples show equivalent or improved photoelectric conversion efficiency compared with the photoelectric conversion devices according to Comparative Examples.

Evaluation III

An image sensor is designed by respectively applying the photoelectric conversion devices according to Examples and Comparative Examples, and YSNR10 of the organic CMOS image sensor is evaluated.

The YSNR10 of the organic CMOS image sensor is a luminance (unit: lux) in which a ratio of signal to noise (signal/noise) becomes 10, wherein the signal is a signal sensitivity obtained by performing a RGB raw signal calculated by a FDTD (finite difference time domain method) with a color correction step through a color correction matrix (CCM), and the noise is a noise generated when measuring the signal in the organic CMOS image sensor. The color correction step is a step of reducing a difference from the real color by image-processing the RGB raw signal obtained from the organic CMOS image sensor. As the YSNR10 has the lower value, the image characteristics are getting the better at a low luminance.

The results are shown in Table 6.

TABLE 6

|  | YSNR10 |
|---|---|
| Example 1 | 84 |
| Comparative Example 1 | 87 |

Referring to Table 6, YSNR10 of the photoelectric conversion device according to Example is lower than that of the photoelectric conversion device according to Comparative Example, and thus it may be expected that the sensitivity of the organic CMOS image sensor may be improved.

While this disclosure has been described in connection with what is presently considered to be practical example embodiments, it is to be understood that the inventive concepts are not limited to the disclosed example embodiments, but, on the contrary, are intended to cover various modifications and equivalent arrangements included within the spirit and scope of the appended claims.

What is claimed is:

1. A sensor, comprising:
 a photoelectric conversion device, the photoelectric conversion device including
  a first electrode and a second electrode facing each other;
  a photoelectric conversion layer between the first electrode and the second electrode, the photoelectric conversion layer configured to absorb light in at least one part of a wavelength spectrum of light and to convert the absorbed light into an electric signal; and
  an inorganic nanolayer between the first electrode and the photoelectric conversion layer, the inorganic nanolayer including a lanthanide element, or an alloy thereof, the lanthanide element including ytterbium (Yb).

2. The sensor of claim 1, wherein the inorganic nanolayer is in contact with the first electrode.

3. The sensor of claim 1, wherein
 one surface of the inorganic nanolayer is in contact with the first electrode, and
 another, opposite surface of the inorganic nanolayer is in contact with the photoelectric conversion layer.

4. The sensor of claim 1, wherein the first electrode includes
 a transparent electrode having a light transmittance of greater than or equal to about 80%, or
 a reflective electrode having a light transmittance of less than about 10%.

5. The sensor of claim 4, wherein the first electrode includes the transparent electrode, and the transparent electrode includes at least one of an oxide conductor and a carbon conductor.

6. The sensor of claim 1, wherein a thickness of the inorganic nanolayer is less than or equal to about 5 nm.

7. The sensor of claim 1, wherein a thickness of the inorganic nanolayer is less than or equal to about 2 nm.

8. The sensor of claim 1, wherein the first electrode is a cathode and the second electrode is an anode.

9. The sensor of claim 1, wherein the photoelectric conversion layer is configured to absorb light in a green wavelength spectrum of light, light in a blue wavelength spectrum of light, light in a red wavelength spectrum of light, or a combination thereof.

10. The sensor of claim 9, further comprising a color filter layer on the photoelectric conversion device.

11. The sensor of claim 1, wherein the photoelectric conversion layer is configured to selectively absorb light in an infrared wavelength spectrum of light.

12. The sensor of claim 1, further comprising a semiconductor substrate, the semiconductor substrate being stacked with the photoelectric conversion device and including a charge storage electrically connected to the photoelectric conversion device.

13. An electronic device comprising the sensor of claim 1.

14. A sensor, comprising:
 a photoelectric conversion device, the photoelectric conversion device including
  a first electrode, the first electrode including a conductor, the conductor being
   a transparent conductor having a light transmittance of greater than or equal to about 80%, or
   a reflective conductor having a light transmittance of less than about 10%;
  a photoelectric conversion layer on the first electrode, the photoelectric conversion layer configured to selectively absorb light in at least one part of a wavelength spectrum of light and to convert the absorbed light into an electric signal; and a second electrode on the photoelectric conversion layer, wherein a surface of the first electrode facing the photoelectric conversion layer is covered by an inorganic nanolayer, the inorganic nanolayer having a thickness of less than or equal to about 5 nm, wherein an effective work function at the surface of the first electrode facing the photoelectric conversion layer is less than a work function of the conductor.

15. The sensor of claim 14, wherein a difference between the work function of the conductor and the effective work function at the surface of the first electrode facing the photoelectric conversion layer is greater than or equal to about 0.5 eV.

16. The sensor of claim 14, wherein the work function of the conductor is greater than or equal to about 4.5 eV, and the effective work function at the surface of the first electrode facing the photoelectric conversion layer is less than or equal to about 4.0 eV.

17. The sensor of claim 16, wherein the effective work function at the surface of the first electrode facing the photoelectric conversion layer is less than or equal to about 3.0 eV.

18. The sensor of claim 14, wherein the inorganic nanolayer includes an inorganic material, and the inorganic material includes a lanthanide element, calcium (Ca), potassium (K), aluminum (Al), or an alloy thereof.

19. The sensor of claim 18, wherein the inorganic material includes the lanthanide element, and the lanthanide element includes ytterbium (Yb).

20. The sensor of claim 14, wherein the photoelectric conversion layer is configured to absorb light in a green wavelength spectrum of light, light in a blue wavelength spectrum of light, light in a red wavelength spectrum of light, or a combination thereof.

21. The sensor of claim 20, further comprising a color filter layer on the photoelectric conversion device.

22. The sensor of claim 14, wherein the photoelectric conversion layer is configured to selectively absorb light in an infrared wavelength spectrum of light.

23. The sensor of claim 14, further comprising a semiconductor substrate, the semiconductor substrate being stacked with the photoelectric conversion device and including a charge storage electrically connected to the photoelectric conversion device.

24. An electronic device comprising the sensor of claim 14.

* * * * *